(12) United States Patent
Uetani et al.

(10) Patent No.: US 6,569,596 B1
(45) Date of Patent: May 27, 2003

(54) NEGATIVE WORKING CHEMICAL AMPLIFICATION TYPE RESIST COMPOSITIONS

(75) Inventors: Yasunori Uetani, Toyonaka (JP); Airi Yamada, Ibaraki (JP); Hiroki Inoue, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 10 days.

(21) Appl. No.: 09/584,149

(22) Filed: May 31, 2000

(30) Foreign Application Priority Data

Jun. 2, 1999 (JP) .......................... 11-154947

(51) Int. Cl.⁷ .............................. G03F 7/004
(52) U.S. Cl. .................. 430/270.1; 430/920; 430/921; 430/919
(58) Field of Search .............. 430/270.1, 920, 430/919, 927, 921

(56) References Cited

U.S. PATENT DOCUMENTS

| | | | |
|---|---|---|---|
| 5,627,011 A | 5/1997 | Munzel et al. | 430/270.1 |
| 5,759,740 A | 6/1998 | Munzel et al. | 430/270.1 |
| 5,928,837 A * | 7/1999 | Sato et al. | 430/270.1 |
| 5,965,748 A | 10/1999 | Kamabuchi et al. | 548/542 |
| 6,245,478 B1 * | 6/2001 | Uetani et al. | 430/191 |

FOREIGN PATENT DOCUMENTS

| | | |
|---|---|---|
| EP | 0 827 025 A1 | 3/1998 |
| GB | 2 341 692 A | 3/2000 |
| GB | 2 349 479 A | 11/2000 |
| JP | 1124848 | 5/1989 |
| JP | 2000-89454 A | 3/2000 |

* cited by examiner

*Primary Examiner*—Rosemary Ashton
(74) *Attorney, Agent, or Firm*—Birch, Stewart, Kolasch & Birch, LLP

(57) ABSTRACT

A negative working chemical amplification type resist composition, which is capable of giving more improved resolution; and comprises an alkali-soluble resin, a cross-linking agent, a N-substituted succinimide compound represented by the following formula (I):

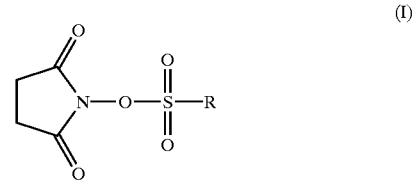

wherein R represents an unsubstituted or substituted alkyl, an alicyclic hydrocarbon residue, an aryl or a camphor group, and an acid generator other than the above N-substituted succinimide compound is provided.

9 Claims, No Drawings

NEGATIVE WORKING CHEMICAL AMPLIFICATION TYPE RESIST COMPOSITIONS

BACKGROUND OF THE INVENTION

The present invention relates to a negative working chemical amplification type resist composition which is used for forming: a resist pattern by irradiation of radiation such as ultra violet ray, electron beam or X-rays and by alkaline development, and for manufacturing semiconductor integrated circuits.

Negative working chemical amplification type resists comprising an alkali-soluble resin, a cross-linking agent and an acid generator are alkali-soluble as they are, but are changed to an alkali-insoluble state by cross-linking the alkali-soluble resin with the cross-linking agent through the post exposure bake (sometimes abbreviated as PEB) with the aid of an acid, working as a catalyst, generated from the acid generator by irradiation with a radiation. Therefore, these resists can form a negative image by irradiation with a radiation through a mask (so-called patterning exposure) and alkaline development. These negative working chemical amplification type resists have frequently been used in the production of integrated circuits because of their excellent resolution and sensitivity. As the recent increase in integration level of the integrated circuits, a further improvement in the resolution has been demanded.

The alkali-soluble resin which have been used in conventional known negative working chemical amplification type resists were novolak resins, polyvinylphenol, and polyvinylphenol compounds in which hydroxyl groups are partially alkyl etherified, as disclosed in JP-A-7-295220. A sufficient and satisfactory resolution for meeting the recent demand, however, could not be obtained by simply improving the alkali-soluble resin.

The purpose of the present invention is to provide negative working chemical amplification type resist compositions having an improved resolution. As the result of extensive studies for attaining such purpose, the present inventors have found the fact that the resolution can be further improved by comprising a certain specific compound together with an alkali-soluble resin, a cross-linking agent and an acid generator. The present invention has been completed based on such fact.

SUMMARY OF THE INVENTION

The present invention provides a negative working chemical amplification type resist composition comprising an alkali-soluble resin; a cross-linking agent; a N-substituted succinimide compound represented by the owing formula (I):

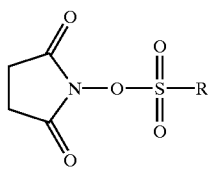

(I)

wherein R represents an unsubstituted or substituted alkyl, an alicyclic hydrocarbon residue, an aryl or a camphor group, and;
an acid generator other than the above N-substituted succinimide compound.

DETAILED DESCRIPTION OF THE INVENTION

The alkali-soluble resin and the cross-linking agent in the present invention may be those commonly used in this field. As the alkali-soluble resin, a novolak resin, polyvinylphenol or a polyvinylphenol compound in which hydroxyl groups are partially alkyl etherified is commonly used.

A novolac resin can usually be obtained by condensing a phenol compound and an aldehyde in the presence of an acid catalyst.

Examples of the phenol compound used in the preparation of the novolac resin include phenol, o-cresol, m-cresol, p-cresol, 2,3-xylenol, 2,5-xylenol, 3,4-xylenol, 3,5-xylenol, 2,3,5-trimethylphenol, 2-tert-butylphenol, 3-tert-butylphenol, 4-tert-butylphenol, 2-tert-butyl-4-methylphenol, 2-tert-butyl-5-methylphenol, 2-methylresorcinol, 4-methylresorcinol, 5-methylresorcinol, 2-methoxyphenol, 3-methoxyphenol, 4-methoxyphenol, 2,3-dimethoxyphenol, 2,5-dimethoxyphenol, 3,5-dimethoxyphenol, 2-methoxyresorcinol, 4-tert-butylcatechol, 2-ethylphenol, 3-ethylphenol, 4-ethylphenol, 2,5-diethylphenol, 3,5-diethylphenol, 2,3,5-triethylphenol, 2-naphthol, 1,3-dihydroxynaphthalene, 1,5-dihydroxynaphthalene, 1,7-dihydroxynaphthalene and a polyhydroxytriphenylmethane compound obtainable by condensation of xylenol and hydroxybenzaldehyde. These phenol compounds can be used singly or in combination of two or more.

Examples of the aldehyde used in the preparation of the novolac resin include aliphatic aldehydes such as formaldehyde, acetaldehyde, propionaldehyde, n-butylaldehyde, iso-butylaldehyde, pivalaldehyde, n-hexylaldehyde, acrolein and crotonaldehyde; alicyclic aldehydes such as cyclohexanealdehyde, cyclopentanealdehyde, furfural and furylacrolein; aromatic aldehydes such as benzaldehyde, o-methylbenzaldehyde, m-methylbenzaldehyde, p-methylbenzaldehyde, p-ethylbenzaldehyde, 2,4-dimethylbenzaldehyde, 2,5-dimethylbenzaldehyde, 3,4-dimethylbenzaldehyde, 3,5-dimethylbenzaldehyde, o-hydroxybenzaldehyde, m-hydroxybenzaldehyde, p-hydroxybenzaldehyde, o-anisaldehyde, m-anisaldehyde, p-anisaldehyde and vanillin; and aromatic-aliphatic aldehydes such as phenylacetaldehyde and cinnamaldehyde. These aldehydes can be used singly or in combination of two or more. Among these aldehydes, formaldehyde is preferably used because of easy availability in the industry.

Examples of the acid catalyst used for condensation of the phenol compound with the aldehyde compound include inorganic acids such as hydrochloric acid, sulfuric acid, perchloric acid and phosphoric acid; organic acids such as formic acid, acetic acid, oxalic acid, trichloroacetic acid and p-toluenesulfonic acid; and bivalent metal salts such as zinc acetate, zinc chloride and magnesium acetate. These acid catalysts can be used singly or in combination of two or more. The condensation reaction can be carried out according to the usual manner, for example, at a temperature within a range of 60 to 120° C. for 2 to 30 hours.

It is preferred for improving the resolution of the resist that a novolak resin having a weight average molecular weight of 900 or less is contained as a part of the alkali-soluble resin. The weight average molecular weight herein refers to a value measured by gel permeation chromatography (GPC) using polystyrene as the standard. This is also applied to other weight average molecular weight referred to below in this specification. These low molecular weight novolak resin oligomer can also be produced by condensing a phenol compound as described above and an aldehyde in the presence of an acid catalyst according to the conventional method. In this reaction, reaction conditions for obtaining low molecular weight product should be adopted. For example, amount of acid should be smaller, such as about 0.001 to 0.01 times the mole of the phenol compound as the raw material, and reaction period should be shorter such as about 1 to 5 hours.

When the low molecular weight novolak resin oligomer is used as a part of the alkali-soluble resin, the rest of the alkali-soluble resin is preferably a resin having a greater weight average molecular weight than said resin. For example, a resin having a weight average molecular weight of 2,000 or more is preferable. Particularly, co-use of a novolak resin mainly comprising a higher molecular weight fraction is preferred for improving the resolution. Specifically, it is preferred that a pattern area of the resin corresponding to polymers having a, molecular weight of 1,000 or less is 25% or less, more preferably 20% or less, of the total pattern area except for the area of the unreacted phenol compound as the raw material. The pattern area herein refers to an area measured by GPC with an UV detector at 254 nm. The molecular weight herein refers to a value measured using polystyrene as the standard, as in the weight average molecular weight described above. The novolak resin mainly comprising a higher molecular weight fraction as described above can be produced, for example, by applying a fractionation to a novolak resin obtained by the condensation reaction. For carrying out the fractionation, adoptable methods include: a method in which a novolak resin is dissolved in a good solvent, and then the solution is poured into water for precipitating the higher molecular weight fraction; and a method in which said solution is mixed with a poor solvent such as pentane, hexane or heptane, and the lower layer containing mainly the higher molecular weight fraction is separated. Examples of the good solvent include alcohols such as methanol and ethanol, ketones such as acetone, methyl ethyl ketone and methyl isobutyl ketone, glycol ethers such as ethyl cellosolve, glycol ether esters such as ethyl cellosolve acetate, ethers such as tetrahydrofuran, or else. It is preferred that the novolak resin mainly comprising a higher molecular weight fraction has a weight average molecular weight of 5,000 or more, particularly 6,000 or more.

Polyvinylphenol and its partially alkyl-etherified product can also be used as an alkali-soluble resin. These can be co-used with a novolak resin. While positional relation between the vinyl group and the hydroxyl group in the vinylphenol as the constituent of polyvinylphenol is not particularly limited, usually the vinyl group is at the para-position of the hydroxyl group. Polyvinylphenol can be produced, for example, by hydrolyzing poly(tert-butoxystyrene) obtained by polymerization of tert-butoxystyrene. Products having various average molecular weights and molecular weight distributions are commercially available and these commercial products can be used.

It is more preferable for improving resolution to use a polyvinylphenol in which hydroxyl groups are partially alkyl etherified. Examples of methods for obtaining partially alkyl-etherified polyvinylphenol include a method in which polyvinylphenol and an alkyl halide are reacted in the presence of an alkali such as potassium carbonate or sodium carbonate as described in JP-A-7-295220. Alkyls as constituents of the alkyl ethers may be those having about 1 to 4 carbon atoms, such as methyl, ethyl, propyl, isopropyl and butyl. The rate of alkyl ether (alkyl-etherified rate) among the hydroxyl groups in polyvinylphenol is generally up to about 35% by mole and preferably 10% by mole or more.

The cross-linking agent may be anyone that results cross-linking of the alkali-soluble resin such as a novolak resin or polyvinylphenol. Examples thereof include epoxy compounds, compounds having a methylol group and compounds having a methylol alkyl ether group. Epoxy cross-linking agents are generally a lower molecular weight phenol compound such as Bisphenol A or an oligomer of novolak resin in which the phenolic hydroxyl is converted to glycidyl ether.

Examples of cross-linking agents having a methylol group or a methylol alkyl ether group include melamine compounds and guanamine compounds represented by the following formula (II):

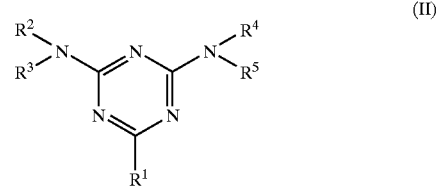

(II)

wherein $R^1$ represents a group: —$NR^6R^7$ or an aryl, at least one of $R^2$, $R^3$, $R^4$, $R^5$, $R^6$ and $R^7$ independently represents a group of —$CH_2OR$, wherein $R^8$ represents hydrogen or an alkyl, and the rest of $R^2$, $R^3$, $R^4$, $R^5$, $R^6$ and $R^7$ represent hydrogen. The aryl is typically phenyl, 1-naphthyl or 2-naphthyl. These phenyl and naphthyls may have a substituent such as an alkyl, an alkoxy and a halogen. The alkyl and alkoxy may have about 1 to 6 carbon atoms. The alkyl represented by $R^8$ is generally methyl or ethyl, in particular methyl.

Examples of the melamine compounds represented by the formula (II), i.e. compounds of the following formula (III):

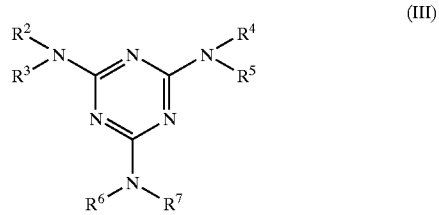

(III)

wherein $R^2$, $R^3$, $R^4$, $R^5$, $R^6$ and $R^7$ are as defined above, include hexamethylol melamine, pentamethylol melamine, tetramethylol melamine, hexamethoxymethyl melamine, pentamethoxymethyl melamine, tetramethoxymethyl melamine and hexaethoxymethyl melamine. Examples of the guanamine compounds represented by the formula (II), i.e., compounds of the formula (II) wherein $R^1$ is an aryl, include tetramethylol benzoguanamine, tetramethoxymethyl benzoguanamine, trimethoxymethyl benzoguanamine and tetraethoxymethyl benzoguanamine.

In addition to the above, compounds having a methylol group or a methylol alkyl ether group such as those listed below can also be used as the cross-linking agents:

(a) 2,6-bis(hydroxymethyl)-4-methylphenol,
(b) 4-tert-butyl-2,6-bis(hydroxymethyl) phenol,
(c) 5-ethyl-1,3-bis(hydroxymethyl)perhydro-1,3,5-triazine-2-one (common name: N-ethyldimethyloltriazone) or its dimetyl ether,
(d) dimethylol trimethyleneurea or its dimethyl ether, (e) 3,5-bis(hydroxymethyl)perhydro-1,3,5-oxadiazine-4-one (common name: N-dimethylolurone) or its dimetyl ether,
(f) tetramethylol glyoxal diureine or its tetramethyl ether.

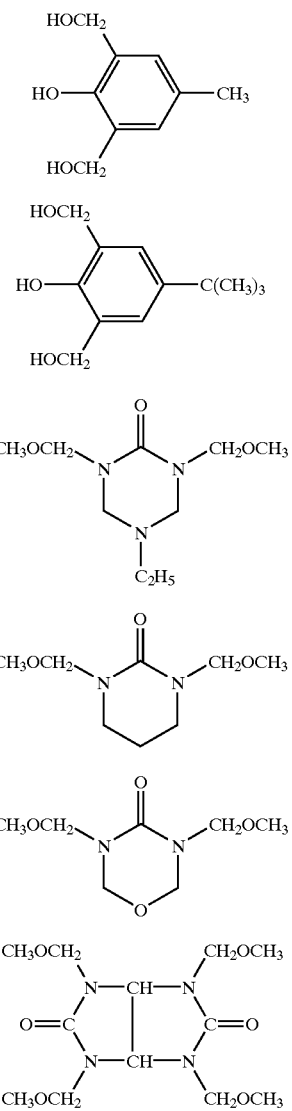

and compounds of (c) to (f), in which the methyl group is substituted by another alkyl group.

In the compositions of the present invention, a N-substituted succinimide compound represented by the above formula (I) and an acid generator other than it are additionally comprised together with the alkali-soluble resin and the cross-linking agent described above.

In the formula (I), R is a sulfonic acid residue and may specifically be an alkyl, an alicyclic hydrocarbon residue, an aryl or a camphor group. The alkyl here may be unsubstituted or substituted. It may have about 1 to 10 carbon atoms. When it has 3 or more carbon atoms, it may be a straight chain or a branched chain. Examples of the groups which may be a substituent on the alkyl include an alkoxy, a halogen, nitro, an alicyclic hydrocarbon residue and an aryl. The alkoxy as the substituent on the alkyl may have about 1 to 4 carbon atoms. Examples of halogen include fluorine, chlorine and bromine. The alicyclic hydrocarbon residue represented by R or the alicyclic hydrocarbon residue as a substituent on the alkyl represented by R refers to a monovalent group which has an alicyclic ring having a single bond for connecting another group, and may have about 5 to 12 carbon atoms. Typical alicyclic hydrocarbon residue includes cycloalkyls and specifically cyclopentyl, cyclohexyl, methylcyclohexyl and the like. The aryl represented by R or aryl as a substituent on alkyl represented by R refers to a monovalent group which has an aromatic ring having a single bond for connecting another group. Typical aryl includes phenyl, naphthyl and the like. These aromatic rings such as phenyl, naphthyl and the like may be unsubstituted or substituted. Examples of the groups which may be a substituent on the aryl include an alkyl having about 1 to 4 carbon atoms, an alkoxy having about 1 to 4 carbon atoms and a halogen such as fluorine, chlorine and bromine, nitro. Examples of the alkyl substituted with an aryl, such group can be called as an aralkyl, include benzyl and phenethyl. Camphor group represented by R refers to a monovalent group derived from camphor. In particular, 10-camphor group, i.e., a group formed by removing the sulfonic acid group from 10-camphorsulfonic acid, is preferred.

Specific examples of N-substituted succinimide compound represented by the formula (I) include the following compounds:

N-(ethylsulfonyloxy)succinimide,
N-(isopropylsulfonyloxy)succinimide,
N-(butylsulfonyloxy)succinimide,
N-(hexylsulfonyloxy)succinimide,
N-(trifluoromethylsulfonyloxy)succinimide,
N-(chloromethylsulfonyloxy)succinimide,
N-(cyclohexylmethylsulfonyloxy)succinimide,
N-(benzylsulfonyloxy)succinimide,
N-(cyclohexylsulfonyloxy)succinimide,
N-(phenylsulfonyloxy)succinimide,
N-(p- or o-tolylsulfonyloxy)succinimide,
N-(2,5-xylylsulfonyloxy)succinimide,
N-(4-ethylphenylsulfonyloxy)succinimide,
N-(2,4,6-trimethylphenylsulfonyloxy)succinimide,
N-(2,4,6-triisopropylphenylsulfonyloxy)succinimide,
N-(4-methoxyphenylsulfonyloxy)succinimide,
N-(4-chlorophenylsulfonyloxy)succinimide,
N-(2,4,5-trichlorophenylsulfonyloxy)succinimide,
N-(2- or 4-nitrophenylsulfonyloxy)succinimide,
N-(4-methoxy-2-nitrophenylsulfonyloxy)succinimide,
N-(1-naphthylsulfonyloxy)succinimide,
N-(10-camphorsulfonyloxy)succinimide, and the like.

N-substituted succinimide compound of the formula (I) acts as an acid generator in far ultraviolet rays exposure, electron beams exposure, X-ray exposure and the like, but is not sensitive to a light having a wavelength of 300 nm or above, such as i-ray having a wavelength of 365 nm. In order to have sensitivity to a light having such a longer wavelength, an acid generator sensitive to a radiation having such a wavelength, such as an oxime acid generator described in JP-A-9-222725, is added. Preferred acid generators for using in combination with N-substituted succinimide compound of the formula (I) include oxime sulfonate compounds represented by the following formula (IV):

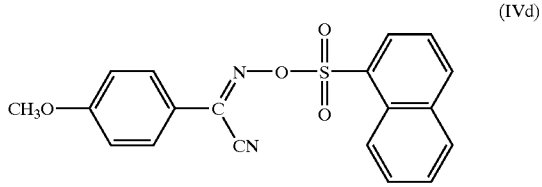

(IV)

wherein R[11] represents an unsubstituted or substituted alkyl, an alicyclic hydrocarbon residue, an aryl or a camphor group, and R[12], R[13] and R[14] independently represent hydrogen, a halogen, an alkyl, an alkoxy or an alkyl-substituted amino.

R[11] in the formula (IV) is also a sulfonic acid residue. Groups similar to those described above in connection with R in the formula (I) may be R[11] in the formula (IV). In addition, R[12], R[13] and R[14] in the formula (IV) are substituents on phenyl and may be hydrogen, a halogen, an alkyl, an alkoxy or an alkyl-substituted amino, respectively. The halogen here includes fluorine, chlorine, bromine and so on. The alkyl and alkoxy may have about 1 to 4 carbon atoms, respectively. The alkyl-substituted amino may be monoalkylamino or dialkylamibno, wherein the alkyl may have about 1 to 6 carbon atoms.

Examples of the oxime sulfonate compound represented by the formula (IV) include compounds listed below by chemical names or the corresponding structural chemical formula:

(IVa) α-(hexylsulfonyloxyimino)-4-methoxybenzyl cyanide,
(IVb) α-(trifluoromethylsulfonyloxyimino)-4-methoxybenzyl cyanide,
(IVc) α-(p-tolylsulfonyloxyimino)-4-methoxybenzyl cyanide,
(IVd) α-(1-naphthylsulfonyloxyimino)-4-methoxybenzyl cyanide,
(IVe) α-(2-naphthylsulfonyloxyimino)-4-methoxybenzyl cyanide,
(IVf) α-(p-tolylsulfonyloxyimino)-4-diethylamino benzyl cyanide,
(IVg) α-(p-tolylsulfonyloxyimino)-3,4-dimethoxybenzyl cyanide.

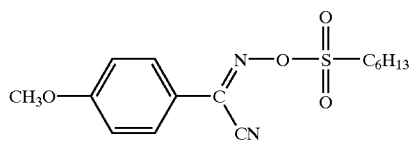

(IVa)

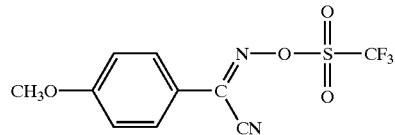

(IVb)

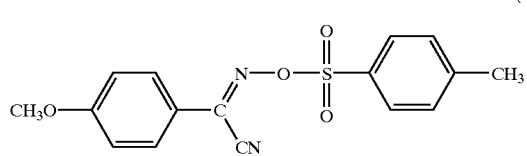

(IVc)

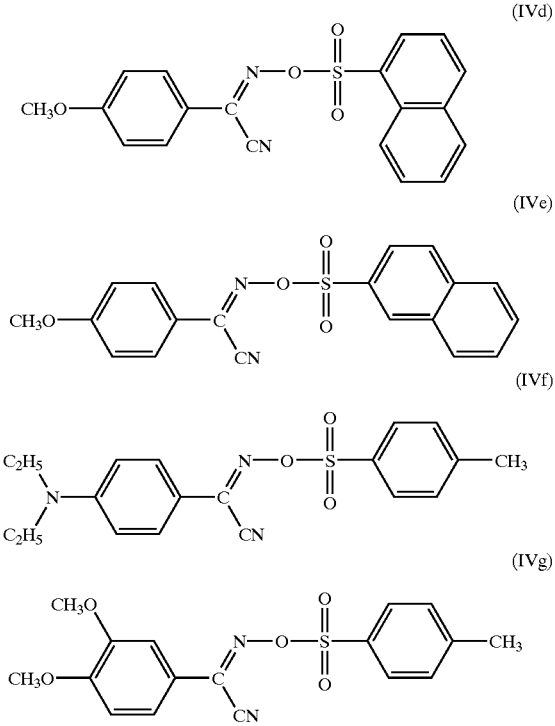

Even when exposure to far ultraviolet rays, electron beams, X-rays and the like to which the N-substituted succinimide compound of the formula (I) is sensitive is adopted, it is preferable to add another acid generator for enhancing the sensitivity of the resist. Examples of such acid generator sensitive to far ultraviolet rays, electron beams, X-rays or the like include onium salt compounds, organic halogen compounds, particularly haloalkyl-s-triazine compounds, sulfone compounds and sulfonate compounds. Specific examples include the following compounds:

(1) Onium Salt Compounds:
  diphenyliodonium trifluoromethanesulfonate,
  4-methoxyphenylphenyliodonium hexafluoroantimonate,
  4-methoxyphenylphenyliodonium trifluoromethanesulfonate,
  bis(4-tert-butylphenyl)iodonium tetrafluoroborate,
  bis(4-tert-butylphenyl)iodonium hexafluorophosphate,
  bis(4-tert-butylphenyl)iodonium hexafluoroantimonate,
  bis(4-tert-butylphenyl)iodonium trifluoromethanesulfonate,
  triphenylsulfonium hexafluorophosphate,
  triphenylsulfonium hexafluoroantimonate,
  triphenylsulfonium trifluoromethanesulfonate,
  4-methoxyphenyldiphenylsulfonium hexafluoroantimonate,
  4-methoxyphenyldiphenylsulfonium trifluoromethanesulfonate,
  p-tolyldiphenylsulfonium trifluoromethanesulfonate,
  2,4,6-trimethylphenyldiphenylsulfonium trifluoromethanesulfonate,
  4-tert-butylphenyldiphenylsulfonium trifluoromethanesulfonate,
  4-phenylthiophenyldiphenylsulfonium hexafluorophosphate,
  4-phenylthiophenyldiphenylsulfonium hexafluoroantimonate, 1-(2-naphthoylmethyl)thioranium hexafluoroantimonate,
1-(2-naphthoylmethyl)thioranium trifluoromethanesulfonate,
4-hydroxy-1-naphthyldimethylsulfonium hexafluoroantimonate,
4-hydroxy-1-naphthyldimethylsulfonium trifluoromethanesulfonate, and the like.

(2) Organic Halogen Compounds
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-penttyloxystyryl)-4,6-bis(trichloromethyl)-1,3,5-triazine, and the like.

(3) Sulfone Compounds
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane, and the like.

(4) Sulfonate Compounds
1-benzoyl-1-phenylmethyl p-toluenesulfonate (common name: benzoin tosilate),
2-benzoyl-2-hydroxy-2-phenylethyl-p-toluenesulfonate (common name: α-methylolbenzoin tosilate),
1,2,3-benzenetriyl trismethanesulfonate,
2,6-dinitrobenzyl p-toluenesulfonate,
2-nitrobenzyl p-toluenesulfonate,
4-nitrobenzyl p-toluenesulfonate,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide, and the like.

In addition, in the chemical amplification type resist utilizing a catalytic action of an acid generated from an acid generator, when a period from the patterning exposure to the post exposure bake is prolonged, a deterioration of performance by inactivation of the acid is generally caused. In order to avoid such inactivation of the acid caused by standing after the irradiation with radiation, it is known that a nitrogen-containing basic organic compound should be used as a quencher. In the present invention, use of a nitrogen-containing basic organic compound as a quencher is also effective for reducing the temperature dependence of post exposure bake and inhibiting the reaction in the unexposed part by a reduction of diffusion of the acid in order to improve stability. Specific examples of the nitrogen-containing basic organic compound include compounds represented by the following formulae:

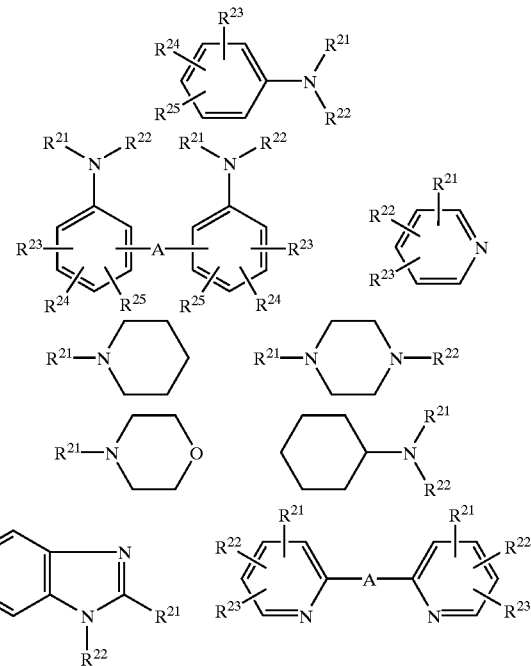

wherein $R^{21}$, $R^{22}$, $R^{23}$, $R^{24}$ and $R^{25}$ independently represent hydrogen, an alkyl which may be optionally substituted with a hydroxyl group, a cycloalkyl, an aryl or an alkoxy and A represents an alkylene, carbonyl or imino. The alkyl and alkoxy represented by $R^{21}$ to $R^{25}$ may be groups having about 1 to 6 carbon atoms. The cycloalkyl may be a group having about 5 to 10 carbon atoms. The aryl may be a group having about 6 to 10 carbon atoms. The alkylene represented by A may be a group having about 1 to 6 carbon atoms and may be a straight chain or a branched chain.

In the resist composition of the present invention, amount of the alkali-soluble resin is preferably within a range of about 50 to 95% by weight, more preferably about 70 to 95% by weight, amount of the cross-linking agent is preferably within: a range of about 0.1 to 30% by weight, amount of the N-substituted succinimide compound of the formula (I) is preferably within a range of about 1 to 30% by weight, more preferably about 2 to 20% by weight, and amount of an acid generator other than the N-substituted succinimide compound is preferably within a range of about 0.5 to 20% by weight, based on the total solid content in the composition. When the amount of the cross-linking agent is too small, the effect by the cross-linking after the radiation irradiation and post exposure bake becomes insufficient. On the other hand, when the amount is too large, the fundamental property, such as resolution, may be lowered. Amount of the novolak resin having a weight average molecular weight of 900 or less optionally used as a part of the alkali-soluble resin is preferably within a range of about 5 to 50% by weight, based on the total solid content in the composition. The amount of such a lower molecular weight novolak resin is a part of the amount of the alkali-soluble resin. Amount of the nitrogen-containing basic organic compound optionally used as a quencher is preferably within a range of about 0.01 to 1% by weight, based on the total solid content in the composition. The resist composition may also contain, if necessary, a small amount of various additives commonly used in this field such as a resin other than the above-described alkali-soluble resin or dye.

A resist solution is prepared by dissolving the above-described ingredients in a solvent. The solvent used here may be anyone that dissolves all the ingredients, has an appropriate drying rate and gives a uniform and smooth film after evaporation of the solvent, and may be one commonly used in this field. Examples of the solvent include glycol ether esters such as ethyl cellosolve acetate, methyl cellosolve acetate, propylene glycol monomethyl ether acetate and propylene glycol monoethyl ether acetate; glycol ethers such as ethyl cellosolve, methyl cellosolve, propylene glycol monomethyl ether and propylene glycol monoethyl ether; esters such as ethyl lactate, butyl acetate, amyl acetate and ethyl pyruvate; ketones such as methyl amyl ketone and cyclohexanone; and cyclic esters such as γ-butyrolactone. These solvents may be used independently or as a mixture of two or more. The amount of the solvent may be adjusted so that, for example, the total solid concentration in the resist solution is about 5 to 50% by weight, considering the applicability, etc.

The negative working resist composition prepared in this manner is applied on a substrate such as silicon wafer according to the conventional manner, such as spin coating, to form a resist film. The film is then subjected to exposure for patterning. The exposure for patterning is carried out using a lower wavelength visible light or near ultraviolet rays such as g-ray of a wave length: 468 nm, i-ray of a wave length: 365 nm; far ultraviolet rays such as KrF eximer laser of a wave length: 248 nm and ArF eximer laser of a wave length: 193 nm; vacuum ultraviolet rays such as $F_2$ eximer laser; soft X-ray of a wave length: 13 nm; electron beams; X-ray and so on. After the exposure for patterning, the film is subjected to the post exposure bake to cause the cross-linking reaction and developed with an alkaline developer. The alkaline developer may be of various kinds used in this field. Examples of the developer generally used include aqueous solution of tetramethyl ammonium hydroxide or (2-hydroxyethyl)trimethyl ammonium hydroxide (common name: choline).

The present invention will now be described in more specifically by means of Examples, which by no means should be construed as a limitation upon the scope of the present invention. In Examples, percents and parts representing contents or amounts to be used are weight based unless otherwise specified.

Synthetic Example 1
(Production of Partially Ethyl-etherified Polyvinylphenol)

Into a 1-liter separable flask with a bottom stopcock equipped with a cooler and a stirrer were charged 25.0 g of poly(p-vinylphenol) (trade name: "S2P"), manufactured by Maruzen Petrochemical Co., Ltd., and 100 g of acetone. These were stirred to form a solution. To the solution were added 11.5 g of anhydrous potassium carbonate and 6.49 g of ethyl iodide. The mixture was heated up to a refluxing temperature and the ref lux state was maintained for 13 hours. After cooling to room temperature, the reaction solution was filtered. The filtrate was combined with 200 g of methyl isobutyl ketone, washed 6 times each with 0.5% aqueous oxalic acid solution and 6 times with ion-exchanged water, respectively, and a phase separation was conducted. The obtained oily phase was concentrated to 71.4 g using an evaporator, combined with 1,500 g of propylene glycol monomehtyl ether acetate and further concentrated to give 70.4 g of a resin solution. The solid concentration of the resin solution was 24.8% as determined by the weight-loss on heating method. The ethyletherification ratio of hydroxyl groups in polyvinylphenol was 20.08% as determined by nuclear magnetic resonance (NMR) measurement. The resin had a weight average molecular weight of 4,780 and referred to as Resin ES.

Synthetic Example 2
(Production of m-cresol Novolak Resin)

Into a 1-liter four necked flask equipped with a reflux condenser, a stirrer and a thermometer were charged 218.3 g of m-cresol, 10.1 g of oxalic acid dehydrate, 68 g of 90% aqueous acetic acid solution and 202 g of methyl isobutyl ketone. The mixture was heated to 80° C. To the mixture was added dropwise 113.0 g of 37% aqueous formaldehyde solution over 1 hour. Then, the mixture was heated up to a refluxing temperature and the reflux state was maintained for 12 hours. The obtained reaction solution was diluted with methyl isobutyl ketone, washed with water and dried to give a methyl isobutyl ketone solution containing 50.3% of a novolak resin. Into a 5-liter bottom-stoppered flask was charged 100 g of the resin solution, which was diluted with 259 g of methyl isobutyl ketone, combined with 258 g of heptane and stirred at 60° C. After standing, phase separation was conducted to give a novolak resin solution as the lower layer. The obtained novolak resin solution of the lower layer was diluted with 2-heptanone and concentrated to give a 2-heptanone solution containing 35.3% of the novolak resin. The novolak resin had a weight average molecular weight of about 9,340, had a pattern area ratio, corresponding to the part having a molecular weight of 900 or less, of about 3.3% as measured by GPC pattern and referred to as Resin MC.

Synthetic Example 3
(Production of m/p-cresol Novolak Resin)

Into a 5-liter four necked flask equipped with a reflux condenser, a stirrer and a thermometer were charged 580.2 g of m/p-cresol containing 61.5% of m-cresol, 14.5 g of p-cresol, 28.1 g of oxalic acid dihydrate, 187.2 g of 90% aqueous acetic acid solution and 553.1 g of 2-heptanone. The mixture was heated to 80° C. To the mixture was added dropwise 344.7 g of 37% aqueous formaldehyde solution over 1 hour. Then, the mixture was heated up to a refluxing temperature and the reflux state was maintained for 12 hours. 259.3 g of the reaction solution thus obtained was diluted with 51.9 g of 2-heptanone, washed with water and dried to give 190.1 g of 2-heptanone solution containing 39.96% of a novolak resin. The novolak resin had a weight average molecular weight of about 22,000, had a pattern area ratio, corresponding to the part having a molecular weight of 900 or less, of about 13.3% as measured by GPC pattern and referred to as Resin MP.

Synthetic Example 4
(Production of Low-molecular Weight Novolak Resin)

Into a 1-liter four necked flask equipped with a reflux condenser, a stirrer and a thermometer were charged 1081 g of m-cresol, 14.5 g of p-cresol, 2.52 g of oxalic acid dihydrate. The mixture was heated to 80° C. To the mixture was added dropwise 242.2 g of 37% aqueous formaldehyde solution over 1 hour. Then, the mixture was heated up to a refluxing temperature and the reflux state was maintained for 3 hours. The obtained reaction solution was concentrated by heating up to 110° C. under a reduced pressure of 200 torr, and, then, further concentrated by heating up to 145° C. under a reduced pressure of 15 torr. The solution thus obtained was diluted with 2-heptanone and washed with water and dried to give 2-heptanone solution containing 36.1% of a novolak resin. The novolak resin had a weight average molecular weight of about 510 and referred to as Resin L.

EXAMPLES 1–5 and

Comparative Examples 1–4

The ingredients, shown below, were mixed, completely dissolved and filtered with a fluorine resin filter having a pore diameter of 0.2 μm to prepare a resist solution.

Resin

| | |
|---|---|
| (solid content and name: see Table 1) | 10 parts |
| Cross-linking agent: | |
| hexamethoxymethylmelamine | 0.75 part |
| Acid generator:, | |
| α-(p-tolylsulfonyloxyimino)-4-methoxybenzylcyanide | 0.2 part |
| Additive: | |
| N-(10-camphorsulfonyloxy)succinimide | see Table 1 |
| Quencher: 1,3-di(4-pyridyl)propane | 0.01 part |
| Solvent (name: see Table 1) | 50 parts* |

*The amount of the solvent included a part from the resin solution.

In Table 1, meanings of abbreviations described in columns of "resin" and "solvent" were as follows:

Resin ES: Partially ethyl-etherified polyvinylphenol having an ethyl-etherisation rate of 20.08%, obtained in Synthetic Example 1.

Resin MC: Novolak resin having a weight average molecular weight of about 9,430, obtained in Synthetic Example 2.

Resin MP: Novolak resin having a weight average molecular weight of about 22,200, obtained in Synthetic Example 3.

Resin L: Novolak resin having a weight average molecular weight of about 510, obtained in Synthetic Example 4.

Solvent PGMEA: Propylene glycol monomethyl ether acetate.

Solvent MAK: 2-heptanone
  (another name: Methyl amyl ketone).

Onto silicon wafers treated with hexamethyldisilazane (HMDS) were spin-coated the resist solutions obtained above so that the film thickness after drying was 1.06 μm. Pre-bake was carried out under a condition of 100° C. for 60 seconds on a direct hot plate. The wafers on which resist films were formed in this manner were exposed to light through a line-and-space pattern of various sizes changing stepwise the exposure amount using an i-ray stepper "NSR 2005i9C" (NA=0.57, σ=0.60) manufactured by Nikon. Then, post exposure bake was carried out under a condition of 110° C. for 60 seconds on a hot plate. The paddle development was effected with 2.38% aqueous tetramethylammonium hydroxide solution for 60 seconds. Patterns obtained after development was observed under a scanning electronic microscope and the effective sensitivity and resolution of respective compositions were evaluated by the method shown below. The results are shown in Table 1.

Effective sensitivity: The light-exposure which give a cross section of 1:1 in 0.35 μm line-and-space pattern.

Resolution: The minimum width of line-and-space pattern splitting by a light exposure at the effective sensitivity.

TABLE 1

| No. | Resin Kind: Amount* | Additive Amount* | Solvent Kind: Amount* | Effective Sensitivity | Resolution |
|---|---|---|---|---|---|
| Examples | | | | | |
| 1 | ES:10 | 1.0 | PGMEA:40 MAK:10 | 70 msec | 0.27 μm |
| 2 | ES:8 MC:1 L:1 | 1.0 | PGMEA:40 MAK:10 | 75 msec | 0.25 μm |
| 3 | MP:7.5 L:2.5 | 0.5 | PGMEA:10 MAK:40 | 80 msec | 0.30 μm |
| 4 | MC:6 L:4 | 0.5 | PGMEA:10 MAK:40 | 180 msec | 0.27 μm |
| 5 | MC:3.5 MP:2.5 L:4 | 0.5 | PGMEA:10 MAK:40 | 110 msec | 0.27 μm |
| Comparative example | | | | | |
| 1 | ES:10 | — | PGMEA:40 MAK:10 | 75 msec | 0.33 μm |
| 2 | MP:10 | — | PGMEA:10 MAK:40 | (0.35 μm pattern was not resolved.) | |
| 3 | MC:10 | — | PGMEA:10 MAK:40 | (0.35 μm pattern was not resolved.) | |
| 4 | MC:3.5 MP:2.5 L:4 | — | PGMEA:10 MAK:40 | 120 msec | 0.31 μm |

*:part

According to the present invention, the resolution of a resist can be more improved and therefore the resist composition contributes to make the semiconductor integrated circuits of higher integration.

What is claimed is:

1. A negative working chemical amplification type resist composition comprising an alkali-soluble resin; a cross-linking agent; a N-substituted succinimide compound represented by the following formula (I):

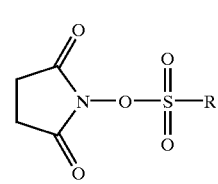

(I)

wherein R represents an unsubstituted or substituted alkyl, an alicyclic hydrocarbon residue, an aryl or a camphor group; and an acid generator other than the above N-substituted succinimide compound;

wherein the alkali-soluble resin comprises a novolak resin having a weight average molecular weight of 900 or less, as a part of the alkali-soluble resin.

2. The negative working chemical amplification type resist composition according to claim 1, wherein the alkali-soluble resin further comprises a novolak resin having a weight average molecular weight of 5,000 or more with a pattern area measured by gel permeation chromatography in which the pattern area of the resin corresponding to polymers having a molecular weight of 1,000 or less is 25% or less of the total pattern area except for the area of the unreacted phenol compound as the raw material.

3. The negative working chemical amplification type resist composition according to claim 1, wherein the alkali-soluble resin further comprises polyvinylphenol or its partially alkyl-etherified product.

4. The negative working chemical amplification type resist composition according to claim 1, wherein the cross-linking agent is a compound having a methylol group or a compound having a methylol alkyl ether group.

5. The negative working chemical amplification type resist composition according to claim 1, wherein the cross-linking agent is a melamine compound represented by the following formula (III):

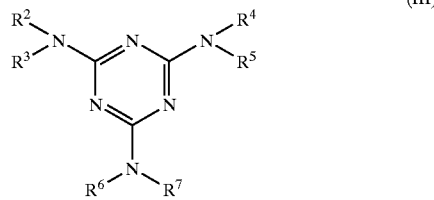

(III)

wherein at least one of $R^2$, $R^3$, $R^4$, $R^5$, $R^6$ and $R^7$ independently represents a group of —$CH_2OR^8$, wherein $R^8$ represents hydrogen or an alkyl, and the rest of $R^2$, $R^3$, $R^4$, $R^5$, $R^6$ and $R^7$ is hydrogen.

6. The negative working chemical amplification type resist composition according to claim 1, wherein the N-substituted succinimide compound represented by the formula (I) is selected from N-(ethylsulfonyloxy)succinimide,
N-(isopropylsulfonyloxy)succinimide,
N-(butylsulfonyloxy)succinimide,
N-(hexylsulfonyloxy)succinimide,
N-(trifluoromethylsulfonyloxy)succinimide,
N-(chloromethylsulfonyloxy)succinimide,
N-(cyclohexylmethylsulfonyloxy)succinimide,
N-(benzylsulfonyloxy)succinimide,
N-(cyclohexylsulfonyloxy)succinimide,
N-(phenylsulfonyloxy)succinimide,
N-(p- or o-tolylsulfonyloxy)succinimide,
N-(2,5-xylylsulfonyloxy)succinimide,
N-(4-ethylphenylsulfonyloxy)succinimide,
N-(2,4,6-trimethylphenylsulfonyloxy)succinimide,
N-(2,4,6-triisopropylphenylsulfonyloxy)succinimide,
N-(4-methoxyphenylsulfonyloxy)succinimide,
N-(4-chlorophenylsulfonyloxy)succinimide,
N-(2,4,5-trichlorophenylsulfonyloxy)succinimide,
N-(2- or 4-nitrophenylsulfonyloxy)succinimide,
N-(4-methoxy-2-nitrophenylsulfonyloxy)succinimide,
N-(1-naphthylsulfonyloxy)succinimide and
N-(10-camphorsulfonyloxy)succinimide.

7. The negative working chemical amplification type resist composition according to claim 1, wherein the acid generator other than the N-substituted succinimide compound of the formula (I) comprises an oxime sulfonate compound represented by the following formula (IV):

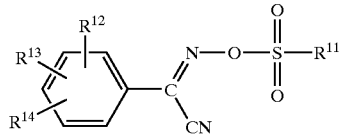

(IV)

wherein $R^{11}$ represents an unsubstituted or substituted alkyl, an alicyclic hydrocarbon residue, an aryl or a camphor group, and $R^{12}$, $R^{13}$ and $R^{14}$ independently represent hydrogen, a halogen, an alkyl, an alkoxy or an alkyl-substituted amino.

8. The negative working chemical amplification type resist composition according to claim 1, wherein the acid generator other than the N-substituted succinimide compound of the formula (I) is a compound sensitive to far ultraviolet rays, electron beams or X-rays.

9. The negative working chemical amplification type resist composition according to claim 1, which further comprises a nitrogen-containing basic organic compound as a quencher.

* * * * *